(12) United States Patent
Furukawa et al.

(10) Patent No.: US 6,190,988 B1
(45) Date of Patent: *Feb. 20, 2001

(54) METHOD FOR A CONTROLLED BOTTLE TRENCH FOR A DRAM STORAGE NODE

(75) Inventors: Toshiharu Furukawa, Essex Junction; Mark C. Hakey; Steven J. Holmes, both of Milton; David Horak, Essex Junction, all of VT (US); William H. Ma, Fishkill, NY (US); James M. Never, Essex Junction, VT (US)

(73) Assignee: International Business Machines Corporation, Armonk, NY (US)

(*) Notice: This patent issued on a continued prosecution application filed under 37 CFR 1.53(d), and is subject to the twenty year patent term provisions of 35 U.S.C. 154(a)(2).

Under 35 U.S.C. 154(b), the term of this patent shall be extended for 0 days.

(21) Appl. No.: 09/086,174

(22) Filed: May 28, 1998

(51) Int. Cl.⁷ .................................................. H01L 21/20
(52) U.S. Cl. ......................... 438/386; 438/389; 438/248; 438/391
(58) Field of Search .................................. 438/248, 246, 438/249, 386, 389, 392; 257/301

(56) References Cited

U.S. PATENT DOCUMENTS

| | | | |
|---|---|---|---|
| 4,397,075 | * 8/1983 | Fatula, Jr. et al. | 438/246 |
| 4,853,348 | * 8/1989 | Tsubouchi et al. | 438/246 |
| 5,032,888 | 7/1991 | Seki . | |
| 5,112,771 | 5/1992 | Ishii et al. . | |
| 5,200,354 | * 4/1993 | Om et al. | 438/243 |
| 5,275,974 | 1/1994 | Ellul . | |
| 5,326,711 | 7/1994 | Malhi . | |
| 5,336,912 | 8/1994 | Ohtsuki . | |
| 5,545,583 | 8/1996 | Lam et al. . | |
| 5,559,350 | 9/1996 | Ozaki et al. . | |
| 5,576,566 | 11/1996 | Kenney . | |
| 5,618,751 | 4/1997 | Golden et al. . | |
| 5,629,226 | 5/1997 | Ohtsuki . | |
| 5,658,816 | * 8/1997 | Rajeevakuma | 438/386 |

OTHER PUBLICATIONS

IBM Technical Disclosure Bulletin, "Method For Making Three–Dimensional Microstructures In Silicon, Particularly A Buried Oxide Structure For Bipolar Integrated Circuits", vol., 21, No. 9, Feb. 1979.

International Electron Devices Meeting, "0.228$\mu m^2$ Trench Cell Technologies With Bottle–Shaped Capacitor For 1 GBit DRAMs", Dec. 10–13, 1995, pp. 661–664.

* cited by examiner

Primary Examiner—Tuan H. Nguyen
(74) Attorney, Agent, or Firm—DeLio & Peterson, LLC; Robert Curcio; Eugene I. Shkurko

(57) ABSTRACT

A bottle-shaped trench capacitor with a buried plate is formed in a controlled etch process. The bottle-shape is fabricated by etching deep trenches from a layered substrate, using the layers as a mask, and covering the side walls of the substrate with protective oxide and nitride layers. With the side walls covered, deep trench etching is then resumed, and a lower trench portion, below the protective layers of the side wall are formed. By diffusing a first dopant in the lower portion of the deep trench region, using the side wall protective layers as a mask, an etch stop is established for a wet etch process at the p/n junction established by the first dopant. The width of the lower trench portion is regulated by the time and temperature of the diffusion. Removing the doped material and applying a second dopant to the lower trench portion establishes a continuous buried plate region between trenches. A capacitor is formed by applying an insulating layer to the trench and filling with a conductor.

22 Claims, 8 Drawing Sheets

METHOD FOR A CONTROLLED BOTTLE TRENCH FOR A DRAM STORAGE NODE

BACKGROUND OF THE INVENTION

1. Field of the Invention

The present invention relates to a semiconductor device, and more particularly to a trench capacitor cell. Specifically, the invention involves the controlled formation of bottle trench capacitors.

2. Description of Related Art

As the integration density of a Dynamic Random Access Memory (DRAM) steadily increases, it becomes necessary to reduce the memory cell size. The memory cell size is primarily determined by the minimum resolution dimension of a lithographic technique, the overlay tolerances between the different features and the layout of these features. At the same time, it is necessary to maintain the minimum required storage capacitance to reliably operate the DRAM. To meet both the cell size requirement and the storage capacitance requirement, a trench capacitor was invented; the simple single device/capacitor memory cell has been altered to provide the capacitor in a vertical dimension. In such designs, the capacitor is formed in a trench in the surface of the semiconductor substrate.

The article "Trench and Compact Structures for DRAMs" by P. Chatterjee et al., International Electron Devices Meeting 1986, Technical Digest paper 61, pp. 128–131, describes variations in trench cell designs through 16 Mb DRAM designs, including the Substrate Plate Trench (SPT) cell described in more detail in U.S. Pat. No. 4,688,063 issued Aug. 18, 1987, to Lu et al. and assigned to the assignee of the instant invention. Additionally, U.S. Pat. No. 5,348,905 issued to Kenney on Sep. 20, 1994, entitled, "METHOD OF MAKING DIFFUSED BURIED PLATE TRENCH DRAM CELL ARRAY", teaches the basic elements and process steps for fabricating a buried plate DRAM cell structure.

In the memory cell, a deep trench is formed in a silicon substrate in a direction perpendicular to the main surface thereof and a memory capacitor is typically formed on the side wall of the trench. The concept of making a semiconductor memory device having a capacitor on the side surface of the trench is commonly known in the prior art.

However, as the size of a DRAM is scaled down by a factor of f (feature size), the trench storage node capacitance decreases by a factor of f. Therefore, it is important to develop methods to increase the storage capacitance.

One method employed to increase capacitance is to widen the bottom portion of the trench, thus, increasing the surface area and creating a "bottle shaped" capacitor. However, in order to space the capacitors close together, control of the etching process used to widen the bottom portion becomes a governing factor. Chemical dry etching is predominantly used in the prior art for creating the bottle-shaped portion of the capacitor.

In U.S. Pat. No. 5,112,771 issued to Ishii, et al. on May 12, 1992, entitled, "METHOD OF FABRICATING A SEMICONDUCTOR DEVICE HAVING A TRENCH", the bottom region of a trench capacitor is enlarged. This is accomplished by leaving a silicon oxide film on the upper side wall of a trench, and enlarging the width of the exposed bottom portion of the trench by an isotropic dry etching process. Since the silicon substrate is isotropically dry etched, it is etched not only in the vertical direction to the surface of the substrate, but also in the horizontal direction. However, as only the bottom region of the trench is etched, the capacitor surface area, although enlarged, is not maximized.

In the International Electron Devices Meeting Technical Digest, 1995, an article teaching of a process for creating a bottle shaped capacitor, by T. Ozaki et al., entitled, "0.228 mm$^2$ TRENCH CELL TECHNOLOGIES WITH BOTTLE-SHAPED CAPACITOR FOR 1GBIT DRAMs", formulates a capacitor with a larger diameter than the opening for the storage node. A collar oxide is formed at the upper portion of the trench by selective oxidation. In-situ phosphorous doped polysilicon is deposited and phosphorous doping is then performed into the trench side wall at the capacitor portion to form a buried plate electrode. The poly-silicon is removed by chemical dry etching and the diameter of the trench under the collar oxide is enlarged at the same time. The in-situ phosphorous doping used in Ozaki creates a buried plate region (plate electrode). There is no doping process step specifically tailored to control the etch rate.

In U.S. Pat. No. 5,629,226 issued to Ohtsuki on May 13, 1997, entitled, "METHOD OF MANUFACTURING A BURIED PLATE TYPE DRAM HAVING A WIDENED TRENCH STRUCTURE", a combination of protecting the upper side walls of a trench and etching doped silicon at the bottom of the trench forms a bottle shaped capacitor. The upper portion of the trench, including the opening portion is a cylinder of diameter R, while the lower portion thereof including the bottom portion is a sphere of diameter $R_{max}$, with $R_{max}$ greater than R. The lower portion of the trench is widened by an isotropic chemical dry etching (CDE) process; pre-doping of the lower trench portion is not employed to control the etch rate. A plurality of buried plate diffusion regions surrounding the lower portions of the trenches are then integrally connected by a heat treatment process.

In these buried plate type trench capacitor DRAM designs, trench to trench dimension remains close to or at a minimum critical dimension that a given lithographic technique can define to maximize density. Thus, the dimensional control of bottle etching becomes critical. The existing prior art for creating bottle shaped trenches by dry etching lacks precise control as a result of not having an associated etch stop.

Bearing in mind the problems and deficiencies of the prior art, it is therefore an object of the present invention to provide a controlled bottle trench capacitor for DRAM Storage Nodes.

A further object of the present invention is to provide a buried plate type DRAM in which the buried plate surrounds the entire bottle capacitor below the neck.

Still other objects of the invention will in part be obvious and will in part be apparent from the specification.

SUMMARY OF THE INVENTION

The above and other objects, which will be apparent to one of skill in the art, are achieved in the present invention which is directed to, in a first aspect, a method for fabricating a trench for a semiconductor device, comprising the steps of: forming a deep trench region in a layered substrate, the trench having an upper portion, a lower portion beneath the upper portion, and insulation on the side walls of the upper portion of the trench; forming a first impurity diffusion region by driving in a dopant along the lower portion of the trench; and, performing an isotropic wet etch to selectively remove the substrate material from the impurity diffusion region to widen the lower portion of the trench below the insulation to form a bottle shaped trench.

This method further comprises: forming a buried plate region by depositing a second impurity diffusion region on the lower portion of the trench; forming an insulating layer on the lower portion of the trench and on the side walls of the upper portion of the trench; and, forming a capacitor by filling the trench with a conductor.

The layered substrate is formed by forming a pad oxide layer, a pad nitride layer, and a chemical vapor deposition oxide layer to the substrate.

Driving-in the dopant to form the first impurity diffusion region, described above, further comprises determining a proper time and temperature for the dopant drive-in to control diffusion depth, wherein the interface of the diffusion region and the substrate is used as an etch stop for the isotropic wet etch.

The invention is directed to, in a second aspect, a method for fabricating a trench for a semiconductor device, comprising the steps of: providing a substrate; forming a plurality of insulating layers on the substrate; forming a deep trench region upper portion with side walls in the layered substrate; forming a lower portion in the trench region; forming a first impurity diffusion region along the lower portion of the trench region; performing an isotropic wet etch to widen the lower portion of the trench region; forming a buried plate region on a portion of the side walls of the trench region; and, forming an insulating layer on the lower portion and the side walls of the trench region.

Forming a lower portion in the trench region comprises covering the side wall of the trench region with protective layers, and removing the substrate material from the trench region below the side wall protective layers.

Forming a first impurity diffusion region comprises doping an impurity into the lower portion of the trench with the impurity dopant masked by the protective layers on the side walls.

Widening the lower portion of the trench comprises removing the substrate material from the first impurity diffusion region of the lower portion via selective wet chemical etch.

Forming a buried plate region comprises diffusing a second dopant impurity into the lower portion of the substrate, using the side wall protective layers as a mask.

Covering the side walls comprises applying a thin oxide layer and a chemical vapor deposition nitride layer to the side walls.

As trenches are adjacent each other in the substrate, the buried plate may be made continuous by connecting the second dopant impurity region of one of the deep trench regions to the second dopant impurity region of adjacent deep trench regions.

In a third aspect, the invention is directed to a method for fabricating a semiconductor device with a controlled bottle trench capacitor, comprising the steps of: providing a substrate; layering the substrate and using the layers as a deep trench mask; removing material from the substrate to form a deep trench within the layered substrate; forming protective layers on a portion of the side walls of the trenches; resuming removal of material from the substrate deep trench below the protective layers; exposing the side wall substrate in the trenches unprotected by the protective layers; depositing a first dopant source material covering at least a portion of the side wall substrate; diffusing at least some of the first dopant material into the exposed side wall substrate in the trenches; removing at least a portion of the first dopant source material and a portion of the first dopant in the exposed side wall substrate in the trenches to form the bottle trench; depositing a second dopant source material and implanting a second dopant at least on a portion of the side walls of the trenches uncovered by the protective layers including diffusing the second dopant into the substrate to form a buried plate region; forming an insulating layer on the lower portion and side walls of the trenches; and, forming a capacitor by filling the bottle trench with a node conductor.

Additionally, in this third aspect, depositing the first dopant source material comprises depositing an arsenic or phosphorous doped silicon dioxide glass, or arsenic or phosphorous doped polycrystalline silicon. Diffusing at least some of the first dopant into the exposed side wall substrate comprises driving-in arsenic to form an n+ doping region, using the protective layers as a mask. Depositing a second dopant source material comprises depositing arsenic or phosphorous doped silicon dioxide glass, and implanting a second dopant comprising arsenic or phosphorous. The doping may also be carried out from a gaseous doping source instead of the solid doping source material. Lastly, completing a bottle-shaped trench capacitor comprises first removing portions of the protective layers, and then forming a node dielectric layer on the side wall of the trench and filling the trench with a conductive material.

BRIEF DESCRIPTION OF THE DRAWINGS

The features of the invention believed to be novel and the elements characteristic of the invention are set forth with particularity in the appended claims. The figures are for illustration purposes only and are not drawn to scale. The invention itself, however, both as to organization and method of operation, may best be understood by reference to the detailed description which follows taken in conjunction with the accompanying drawings in which:

DESCRIPTION OF THE PREFERRED EMBODIMENT(S)

Figure 1:
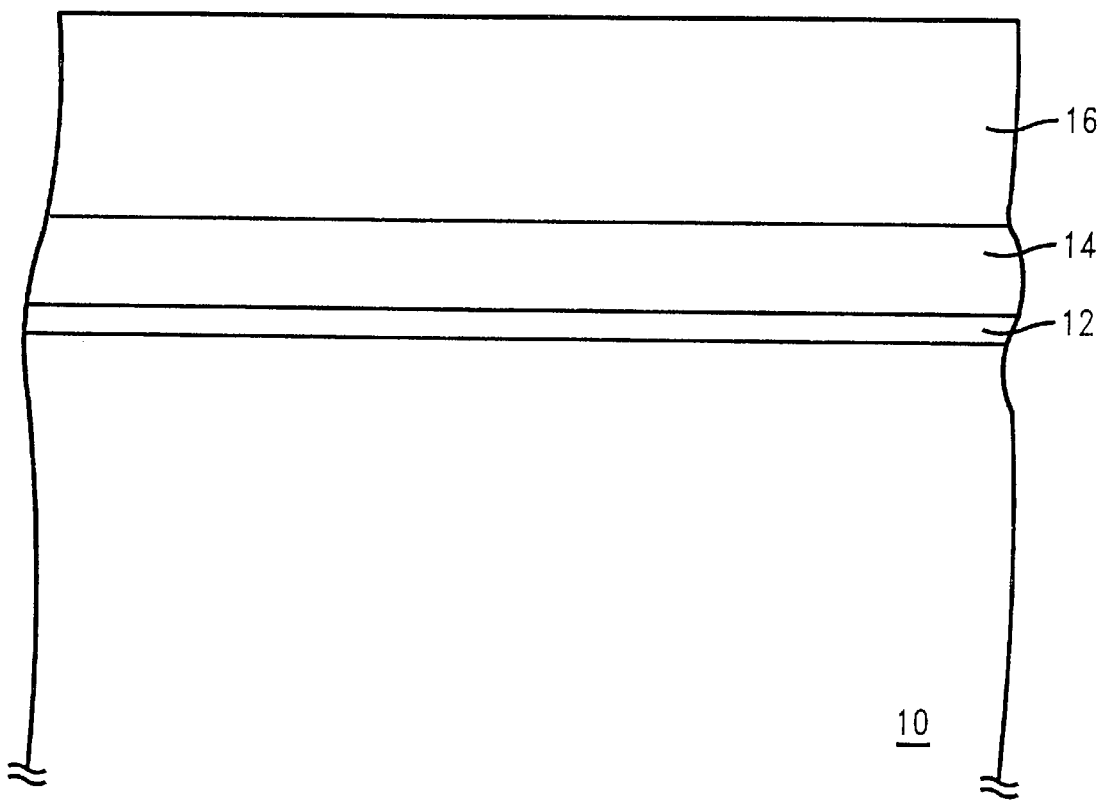
FIG. 1 is a vertical cross section of a silicon substrate layered with oxide-nitride-oxide layers.

In describing the preferred embodiment of the present invention, reference will be made herein to FIGS. 1–8 of the drawings in which like numerals refer to like features of the invention. Features of the invention are not necessarily shown to scale in the drawings.

In the prior art, trench to trench dimensions are already close to or at a minimum as defined by current lithographic techniques. In order to increase the capacitance, the extra surface area created by widening the trench region may cause adjacent trenches to be closer than the minimum required separation distance. Or, in the worst case, adjacent trenches may merge together. Thus, the control of trench etching becomes critical. The capacitance may be increased by deepening the trench, but the resistance increases to degrade the performance. Also, the deep trench etch process may become too long to be practical. In the present invention, the precise trench dimension control is achieved by doping a silicon substrate around the lower portion of the deep trench region, and then preferentially etching the doped silicon by a wet etch process. The p/n junction created by the doping from the exposed trench sidewall forms an etch stop for the wet etch process. This enables accurate control of the etch process. Electrochemical reactions will stop the etching process at the p/n junction. Diffusion of the dopant can be controlled to the order of a few nanometers or better by adjusting temperature and time parameters. Thus, the etching is controlled by directly controlling the amount of impurity and the diffusion depth into the substrate. This tightly controlled etch process allows widened trench designs to be spaced close together. Thus, tight bottle-to-bottle dimension control by doping the silicon substrate around the deep trench to control the etch process is a significant advantage of the present invention over the prior art.

A method for fabricating a bottle-shaped trench capacitor will now be described in detail with reference to FIGS. 1–8. This method depicts a preferred embodiment to build a trench capacitor for DRAM applications which can be integrated into various DRAM processes, such as that described in U.S. Pat. No. 5,348,905.

FIG. 1 depicts a layered substrate 10, made of, for example, p-type, with sequential standard pad oxide 12, pad nitride 14, and chemical vapor deposition (CVD) oxide layers 16. These layers are applied to be used as a deep trench etch mask. The pad oxide 12 is thermally grown, typically 5 nm or less in thickness. The nitride layer 14 is then deposited (10 nm or less) and a CVD SiO$_2$ layer 16 is deposited on the substrate's top surface.

Figure 2:
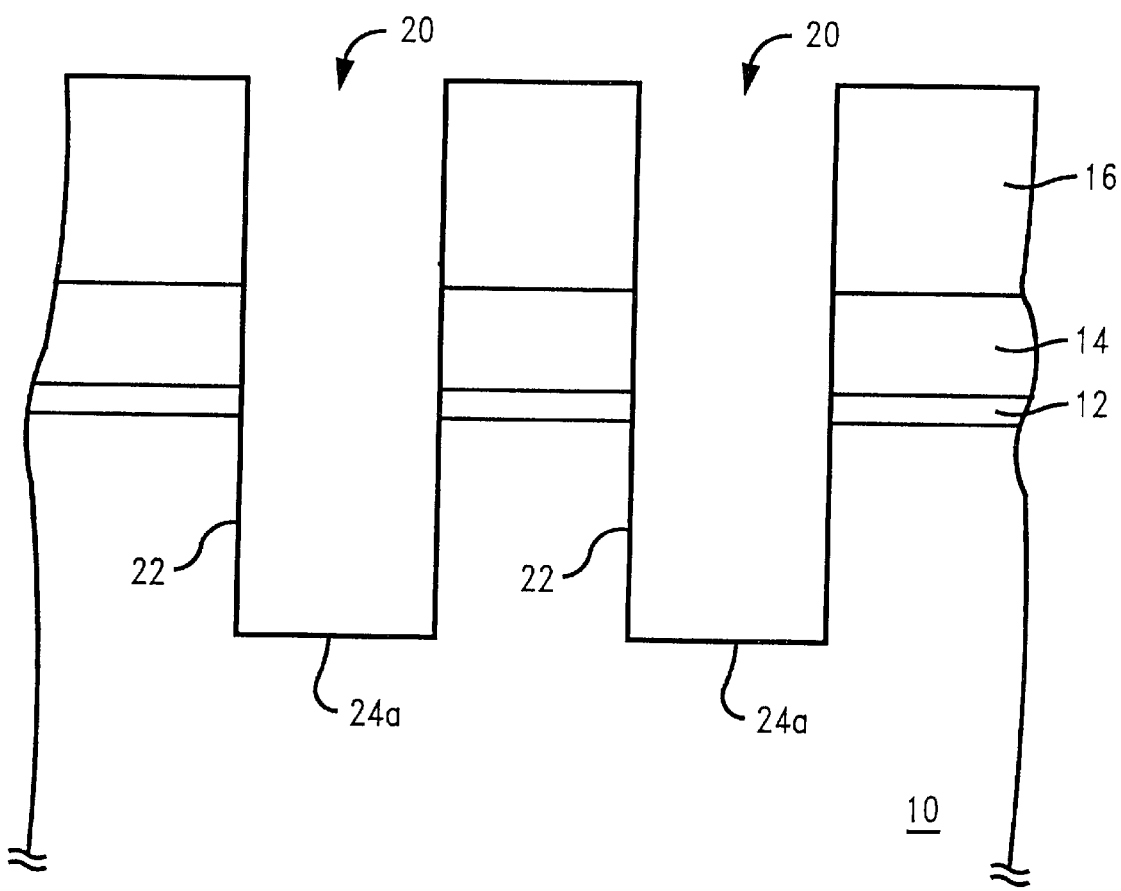
FIG. 2 is a vertical cross section of the layered substrate with deep trenches etched therein.
Figure 3:
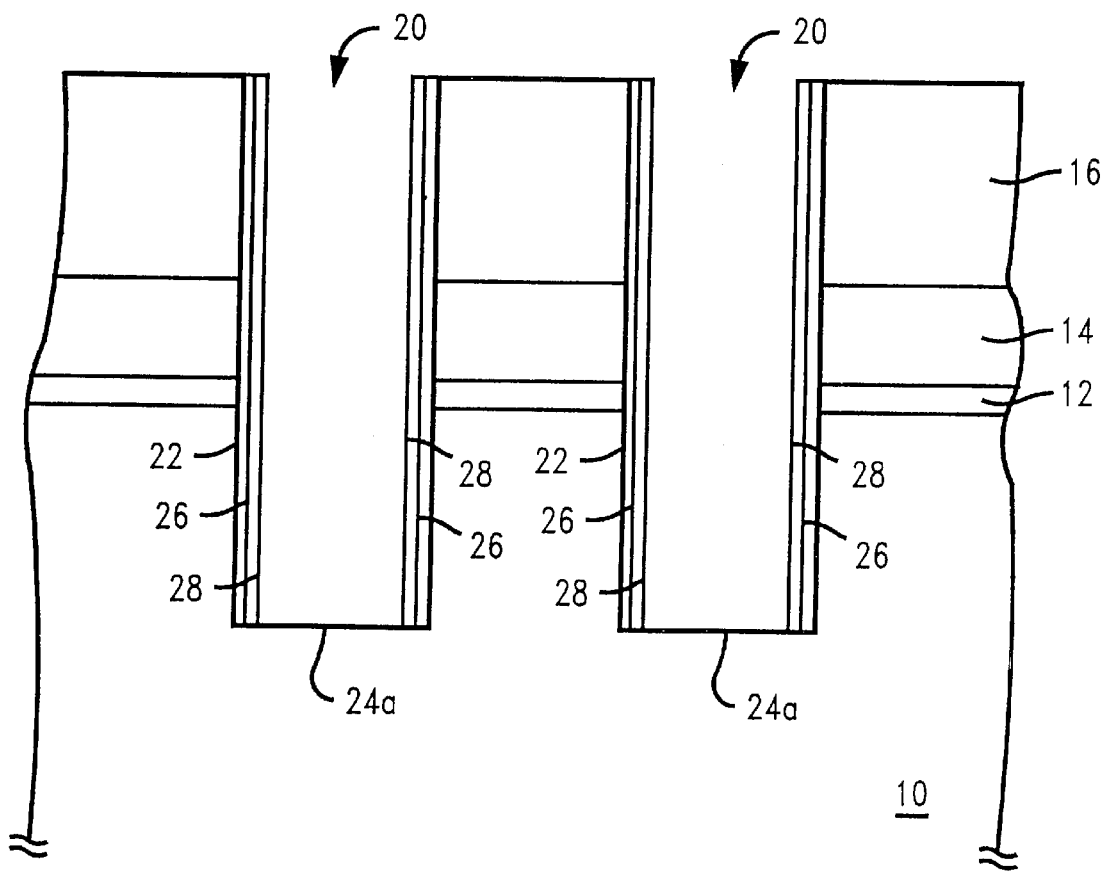
FIG. 3 is vertical cross section of the layered substrate with protective layers applied to the side walls.

Referring to FIG. 2, a plurality of adjacent deep trenches 20 are then etched into the substrate, removing substrate material through the top layers (12, 14, 16), about 1.5 $\mu$m deep from the substrate surface. In forming the deep trench regions, a plurality of trench well regions are created which are surrounded by a continuous substrate. The deep trenches have side walls 22 and bottom surface 24a exposed. A protective or insulation layer is then applied to side walls 22, comprising a thermally grown thin oxide layer 26 and a deposited CVD nitride layer 28, as shown in FIG. 3.

Figure 4:
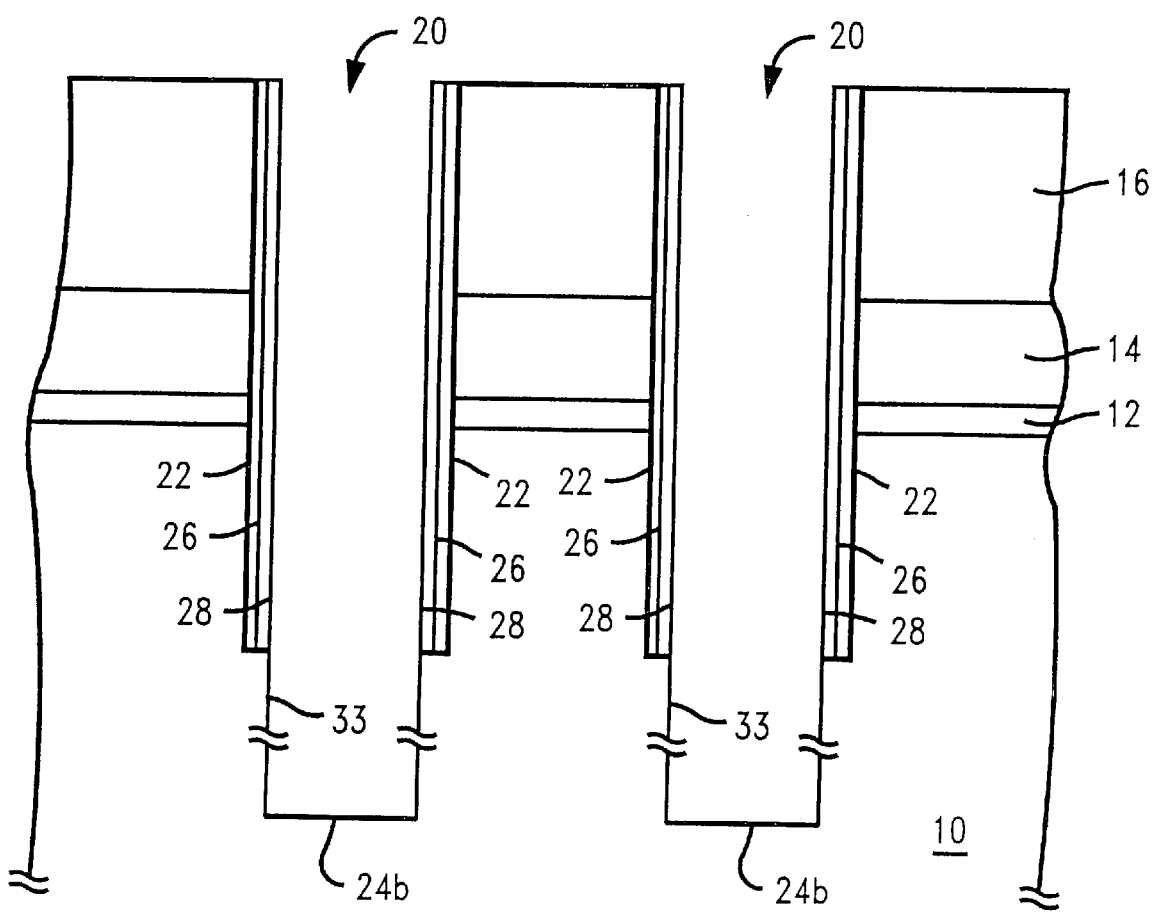
FIG. 4 is a vertical cross section of the layered substrate of FIG. 3 with the lower portion of the trench etched.

Deep trench etching is then resumed, using the oxide-nitride-oxide (12,14,16) layers as a mask, such that the etch only removes material from the bottom 24a of the trench. The deep trench 20 is shown in FIG. 4 with new bottom surface 24b deeper into the substrate than the previous bottom surface 24a, and below the side wall 22 protective layer 26, 28. This creates a trench lower portion with unprotected side walls 33.

Figure 5:
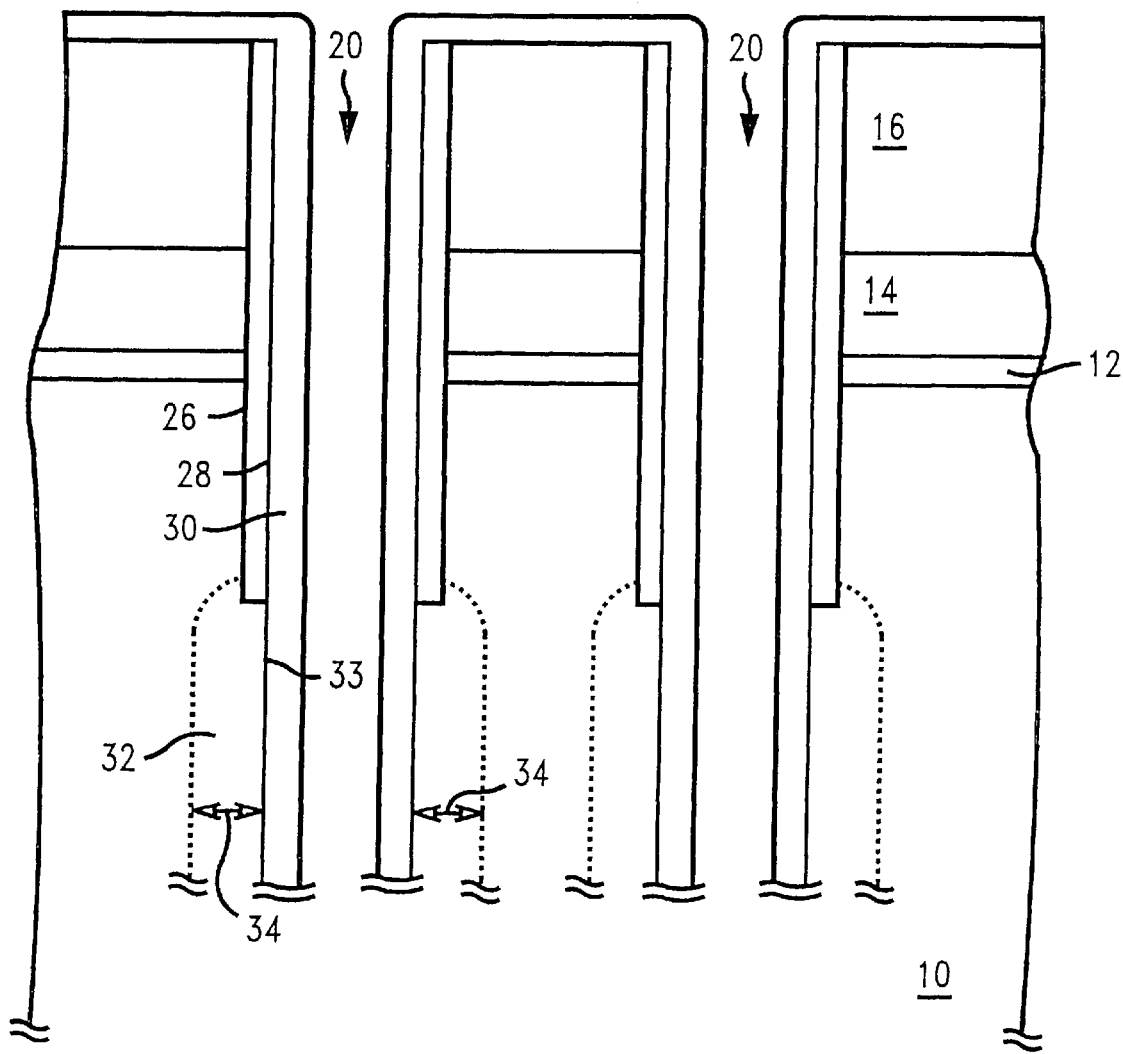
FIG. 5 is a vertical cross section of the layered substrate of FIG. 4 with an arsenic doped silicon dioxide glass (ASG) layer annealed to dope the lower portion of the trench.

After completion of the deep trench etch, a dopant source material 30, preferably arsenic or phosphorous doped silicon dioxide glass, or arsenic or phosphorous doped polycrystalline silicon is deposited, as shown in FIG. 5, along the substrate surface and trench side walls. A first dopant, preferably arsenic or phosphorous, is then driven-in to form an n+ doping region 32 in the silicon substrate around the trench lower portion from the arsenic doped silicon dioxide glass. The exposed silicon surface which is not covered by the oxide/nitride protective layer is doped. Instead of ASG, a gaseous doping source such as AsH$_3$ or plasma doping source may also be used to dope the side wall. The present invention permits the junction depth of the n+/p− interface, i.e., the width of the lower trench expansion 34, to be tightly controlled by the temperature and time of the diffusion anneal.

Figure 6:
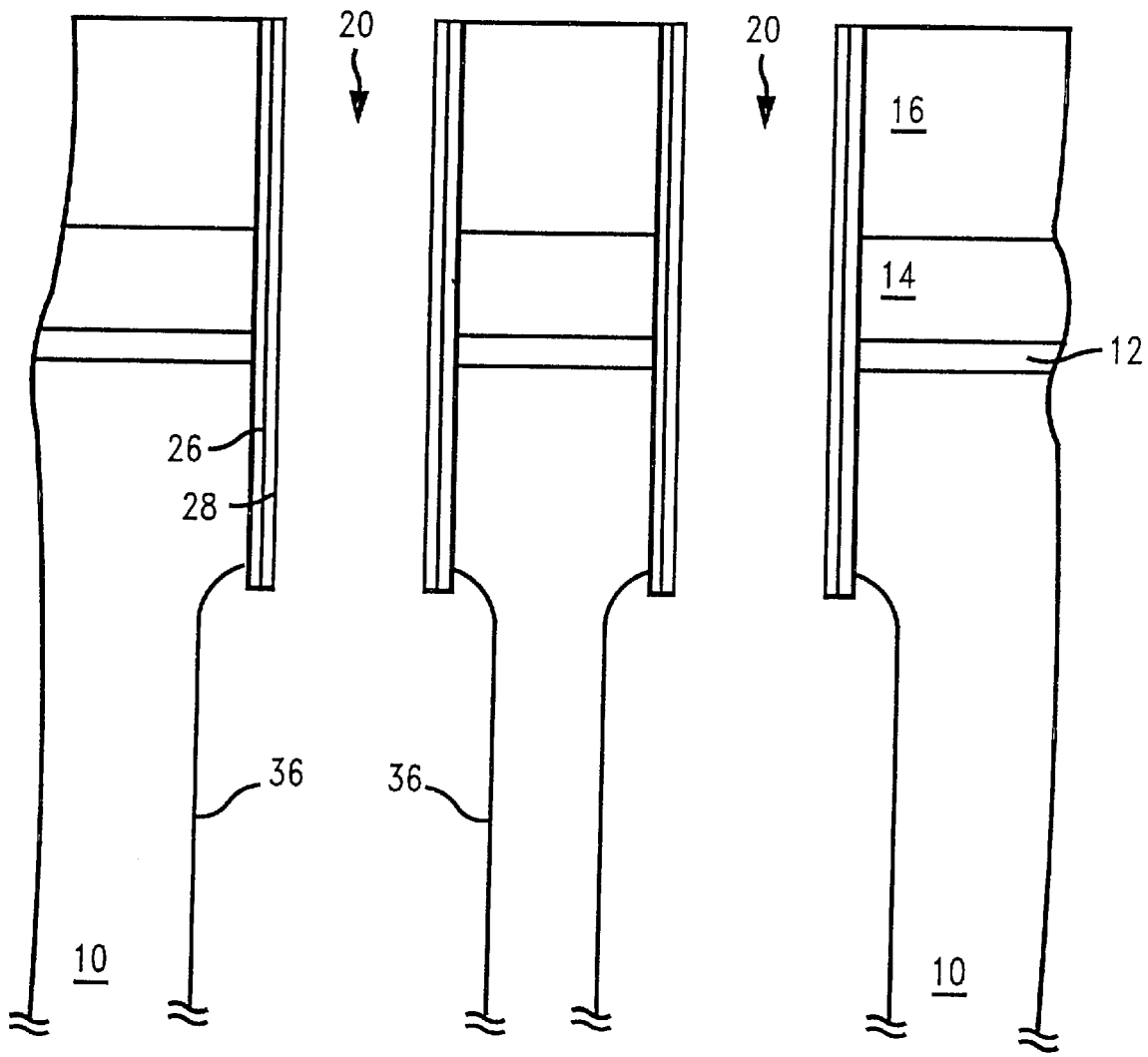
FIG. 6 is a vertical cross section of the layered substrate of FIG. 5 with the arsenic doped silicon dioxide glass layer and the doped silicon in the lower trench portion removed.

Referring to FIG. 6, the dopant source material 30 is then striped away and the n+ doped substrate region 32 is wet etched isotropically. Selective dry etching may also be used to selectively etch the n+ doped substrate. By removing the doped silicon substrate of the exposed side wall 33 a bottle trench geometry wider than the opening portion of the trench well 20 is formed. A new lower side wall 36 is also formed.

Figure 7:
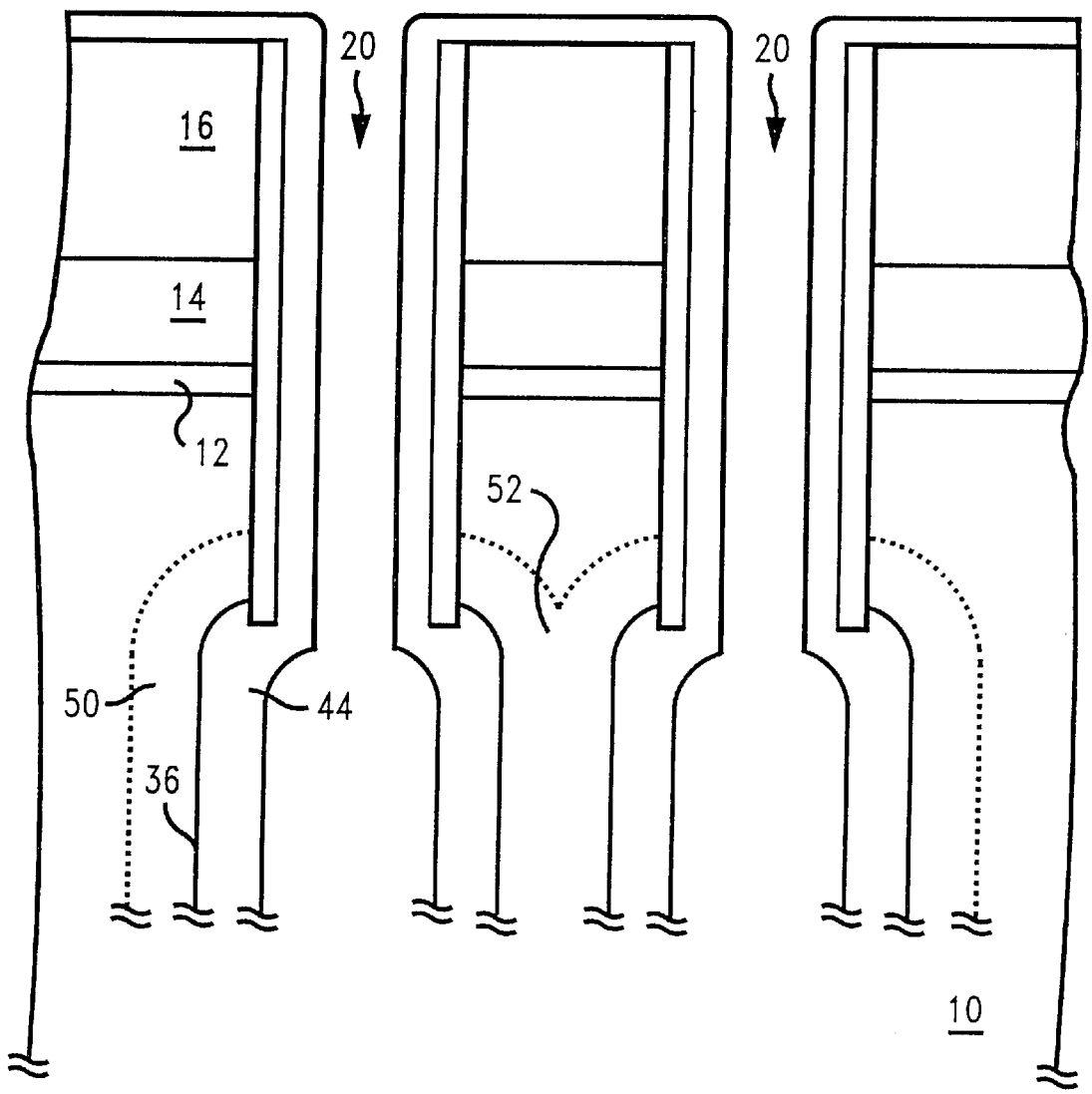
FIG. 7 is a vertical cross section of the layered substrate of FIG. 6 with an arsenic doped silicon dioxide glass layer deposited and annealed to form a buried plate region.

As shown in FIG. 7, a second dopant source material 44 is then deposited. This dopant source material is preferably arsenic doped silicon dioxide glass (ASG) but may be other material. A second implant region 50 is formed by the preferred method of driving arsenic from ASG to form a buried plate in the lower trench region, on the portion of the exposed side walls not protected by layers 26, 28, and using the protective layers 26, 28 on the upper side walls 22 as a doping mask. The second n+ region 50 driven-in by a second dopant is used to create a buried plate region for the trench capacitors. Adjacent trenches have connected buried plate regions 52, as depicted in FIG. 7, to serve as a plate diffusion region. Using the same insulators as a mask for etching and buried plate doping, a self-alignment of the bottle neck to the buried plate doping can be achieved.

Figure 8:
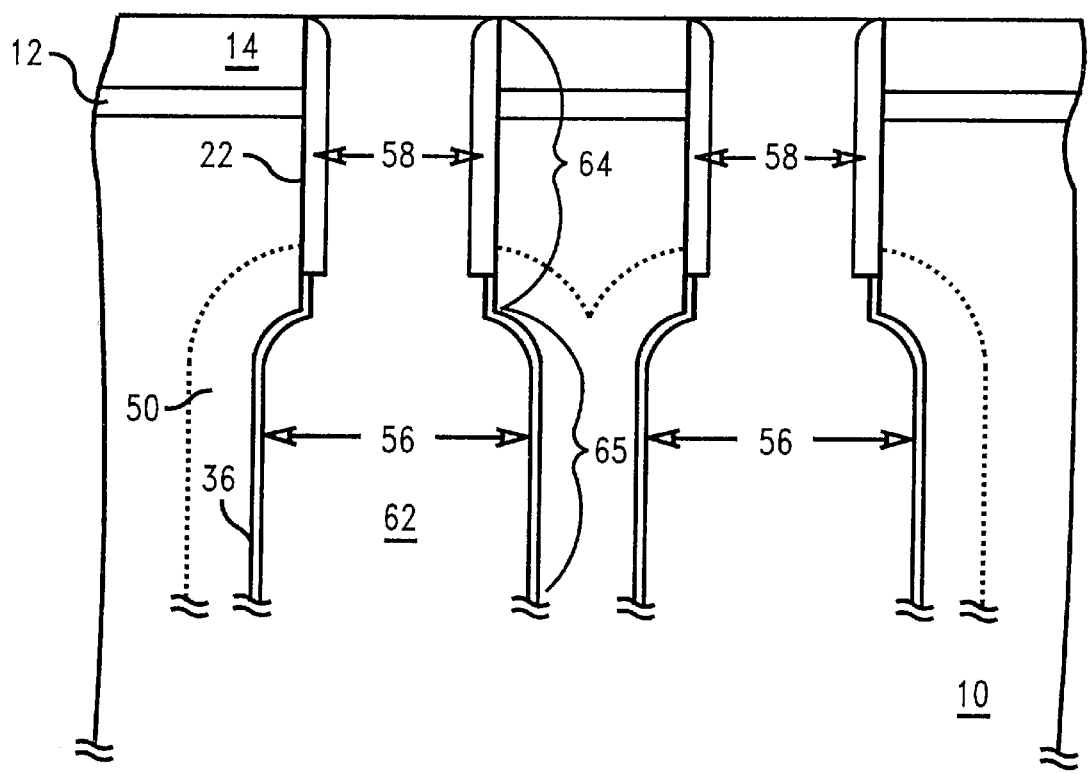
FIG. 8 is a vertical cross section of the layered substrate of FIG. 7 with a collar oxide formed on the bottle neck surface and node dielectric in the trench side wall, and heavily doped n+ polysilicon in the trench well.

Lastly, referring to FIG. 8, dopant source material 44, oxide layer 26 and nitride layer 28 are removed and a node dielectric layer 56 is formed on the side walls 36 and bottom 24b (not shown) of trench 20. A node dielectric layer is typically formed by depositing a thin layer of silicon nitride by chemical vapor deposition (CVD) followed by oxidation anneal of the silicon nitride surface. The trench is then filled with heavily doped n-type polycrystalline silicon 62 and recessed below the substrate surface (trench opening). The trench collar 58 is formed on the side walls 22 of the recessed trench by depositing silicon dioxide conformally by CVD and anisotropically etching the oxide from the top surface of the substrate and the lower portion of the trench recess. The trench is then refilled with heavily doped n-type polycrystalline silicon and planarized to the substrate surface by chemical-mechanical polishing.

By this method, the upper portion of the trench, the "bottle neck" 64, is narrower than the lower trench portion 65. A capacitor formed in this geometry will have greater surface area and, therefore, more capacitance, than one formed with a straight deep trench well. Additionally, tightly controlling the wet etch process by pre-doping the exposed side walls allows for tight placement of trenches and better control of capacitance which increases the cell density.

The method of the present invention may be employed using an opposite polarity configuration. Thus, an n-type layered substrate may be used in place of a p-type, and boron doping in place of arsenic, etc. Otherwise, using the same method described above.

While the present invention has been particularly described, in conjunction with a specific preferred embodiment, it is evident that many alternatives, modifications and variations will be apparent to those skilled in the art in light of the foregoing description. It is therefore contemplated that the appended claims will embrace any such alternatives, modifications and variations as falling within the true scope and spirit of the present invention.

Thus, having described the invention, what is claimed is:
What is claimed is:

1. A method for fabricating a trench for a semiconductor device, comprising the steps of:
   a) forming a deep trench region in a layered substrate, said trench having side walls with an upper portion, a lower portion beneath said upper portion, a trench bottom, and a width;
   b) insulating said side walls of said upper portion of said trench;
   c) forming a first impurity diffusion region by driving in a dopant along said lower portion of said trench, said impurity diffusion region being tightly controlled by temperature and time of diffusion; and,
   d) performing an isotropic wet etch to remove material of said layered substrate from said impurity diffusion region to widen said width of said lower portion of said trench below said insulation such that removal of material of said layered substrate to widen said width of said lower portion of said trench comprises removing said material from the side walls of said lower portion, said width being tightly controlled by said first impurity diffusion region.

2. The method of claim 1 further comprising:
   e) forming a buried plate region by depositing a second impurity diffusion region on said lower portion of said trench;
   f) forming an insulating layer on said lower portion of said trench and on said side walls of said upper portion of said trench; and,
   g) forming a capacitor by filling said trench with a conductive material.

3. The method of claim 1, wherein said step (a), providing a layered substrate, comprises applying a pad oxide layer, a pad nitride layer, and a chemical vapor deposition oxide layer to said substrate.

4. The method of claim 1, wherein said step (c), driving-in said dopant to form said first impurity diffusion region, further comprises determining a proper time and temperature for said dopant drive-in to control diffusion depth, wherein the interface of said diffusion region and said substrate is used as an etch stop for said isotropic wet etch.

5. A method for fabricating a trench for a semiconductor device, comprising the steps of:
   a) providing a substrate;
   b) forming a plurality of insulating layers on said substrate;
   c) forming a deep trench region upper portion having side walls in said layered substrate, and a width;
   d) forming a lower portion in said trench region having side walls, a bottom, and a width;
   e) forming a first impurity diffusion region along said lower portion of said trench region, said impurity diffusion region being tightly controlled by temperature and time of diffusion;
   f) performing an isotropic wet etch to widen said width of said lower portion of said trench region, such that removal of material of said substrate to widen said width of said lower portion comprises removing said material from the side walls of said lower portion;
   g) forming a buried plate region on a portion of said side walls of said trench region; and,
   h) forming an insulating layer on said lower portion and said side walls of said trench region.

6. The method of claim 5, wherein said step (c), forming a deep trench region, further comprises forming a plurality of trench well regions on said substrate by removing material from said substrate, using said insulating layers as a mask, said well regions being surrounded by said substrate.

7. The method of claim 5, wherein said step (d), forming a lower portion, comprises covering said side wall of said trench region with protective layers, and removing material from said substrate from said trench region below said side wall protective layers.

8. The method of claim 7, wherein said step (g), forming a buried plate region, comprises diffusing a second dopant impurity into said substrate, using said side wall protective layers as a mask.

9. The method of claim 8, further comprising forming a plurality of trenches by steps (a) through (h), said trenches being adjacent each other in said substrate, and wherein said buried plate is made continuous by connecting said second dopant impurity region of one of the deep trench regions to the second dopant impurity region of adjacent deep trench regions.

10. The method of claim 7, wherein covering said side walls comprises applying a thin oxide layer and a chemical vapor deposition nitride layer to said side walls.

11. The method of claim 5, wherein said step (e), forming a first impurity diffusion region, comprises doping an impurity into said lower portion of said trench, said impurity dopant masked by said protective layers on said side walls.

12. The method of claim 5, wherein said step (f), widening said lower portion, comprises removing said substrate material from said first impurity diffusion region of said lower portion side walls.

13. A method for fabricating a semiconductor device with a controlled bottle trench capacitor, comprising the steps of:
   a) providing a substrate;
   b) layering said substrate and using said layers as a deep trench mask;
   c) removing material from said substrate to form a deep trench within said layered substrate;
   d) forming protective layers on a portion of the side walls of said trenches;
   e) resuming removal of material from said substrate deep trench below said protective layers;
   f) exposing said side wall substrate in said trenches unprotected by said protective layers;
   g) depositing a first dopant source material covering at least a portion of said side wall substrate;
   h) diffusing at least some of a first dopant material into said exposed side wall substrate in said trenches, said diffusing being tightly controlled by temperature and time;
   i) widening said trench by removing at least a portion of said first dopant source material and a portion of said substrate doped by said first dopant in said exposed side wall substrate in said trenches to form said bottle trench, such that removal of material of said layered substrate to widen said width of said exposed side wall substrate of said trench comprises removing said material from the side walls of said trench unprotected by said protective layers;
   j) depositing a second dopant source material and implanting a second dopant at least on a portion of said side walls of said trenches uncovered by said protective layers including diffusing said second dopant into said substrate to form a buried plate region;

k) forming an insulating layer on the lower portion and side walls of said trenches; and, l) forming a capacitor by filling said bottle trench with a node conductor.

14. The method of claim 13, wherein said step (b), layering said substrate, comprises applying a pad oxide layer, a pad nitride layer, and a chemical vapor deposition oxide layer.

15. The method of claim 13, wherein said steps (c) and (e), removing material from said substrate, comprises using an etching process.

16. The method of claim 13, wherein said step (d), forming protective layers, comprises growing a thin oxide layer and chemical vapor deposition of a nitride layer on a portion of said side walls of said trenches.

17. The method of claim 13, wherein said step (g), depositing a first dopant source material, comprises depositing arsenic or phosphorous doped silicon dioxide glass, or arsenic or phosphorous doped polycrystalline silicon.

18. The method of claim 17, wherein said step (h), diffusing at least some of said first dopant into said exposed side wall substrate, comprises driving-in arsenic to form an n+ doping region, using said protective layers as a mask.

19. The method of claim 13, wherein said step (i), removing said substrate doped by said first dopant, comprises applying an isotropic wet etch process using said protective layers as a mask.

20. The method of claim 13, wherein said step (j), depositing a second dopant source material, comprises depositing arsenic or phosphorous doped silicon dioxide glass, and implanting a second dopant comprising arsenic or phosphorous.

21. The method of claim 13, wherein said step (h), diffusing a first dopant, further comprises controlling the junction depth of the n+/p− region by regulating the temperature and time of the dopant drive-in.

22. The method of claim 13, wherein said step (g), depositing a first dopant source material, comprises using a gaseous doping source or plasma doping source.

* * * * *